United States Patent
Yamaguchi (10) Patent No.: US 6,631,552 B2
(45) Date of Patent: Oct. 14, 2003

(54) APPARATUS FOR AND METHOD OF CORRECTING COMPONENT HOLDING POSITION

(75) Inventor: Minoru Yamaguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/918,455

(22) Filed: Aug. 1, 2001

(65) Prior Publication Data

US 2002/0056188 A1 May 16, 2002

(30) Foreign Application Priority Data

Aug. 3, 2000 (JP) ..................... P2000-235816

(51) Int. Cl.⁷ .............................................. B23P 19/00
(52) U.S. Cl. ............................. 29/739; 29/740; 29/743
(58) Field of Search .................... 29/739, 740, 743, 29/709, 832, 593; 414/752.1

(56) References Cited

U.S. PATENT DOCUMENTS

| | | | | |
|---|---|---|---|---|
| 4,881,319 A | * | 11/1989 | Yagi et al. ............... | 228/6.2 |
| 4,980,971 A | * | 1/1991 | Bartschat et al. ......... | 29/720 |
| 5,177,864 A | * | 1/1993 | Oyama .................... | 29/705 |
| 5,204,912 A | * | 4/1993 | Schimanski ............... | 348/126 |
| 5,208,969 A | * | 5/1993 | Hidese .................... | 29/740 |
| 5,249,356 A | * | 10/1993 | Okuda et al. ............. | 29/740 |
| 5,379,514 A | * | 1/1995 | Okuda et al. ............. | 29/740 |
| 5,541,834 A | * | 7/1996 | Tomigashi et al. ......... | 29/743 |
| 5,661,090 A | * | 8/1997 | Otani ..................... | 29/740 |
| 5,694,219 A | * | 12/1997 | Kim ....................... | 29/720 |
| 5,743,005 A | * | 4/1998 | Nakao et al. ............. | 29/712 |
| 5,768,759 A | * | 6/1998 | Hudson ................... | 29/407.04 |
| 5,839,187 A | * | 11/1998 | Sato et al. .............. | 29/743 |
| 5,864,944 A | * | 2/1999 | Kashiwagi et al. ......... | 29/743 |
| 5,907,900 A | * | 6/1999 | Okazaki et al. ........... | 250/208.1 |
| 5,908,282 A | * | 6/1999 | Onodera .................. | 29/757 |
| 5,937,513 A | * | 8/1999 | Inutsuka et al. .......... | 198/349.6 |
| 5,953,447 A | * | 9/1999 | Jin ....................... | 250/559.3 |
| 5,983,490 A | * | 11/1999 | Sakemi ................... | 29/743 |
| 6,082,428 A | * | 7/2000 | Ando et al. .............. | 156/344 |
| 6,148,511 A | * | 11/2000 | Taguchi .................. | 29/739 |
| 6,195,165 B1 | * | 2/2001 | Sayegh ................... | 356/400 |
| 6,216,341 B1 | * | 4/2001 | Nakahara ................. | 29/825 |
| 6,266,873 B1 | * | 7/2001 | Kitamura et al. .......... | 29/739 |
| 6,291,830 B1 | * | 9/2001 | Duquette ................. | 250/559.3 |
| 6,336,268 B1 | * | 1/2002 | Inutsuka et al. .......... | 29/740 |
| 6,356,352 B1 | * | 3/2002 | Sumi et al. .............. | 29/740 |

FOREIGN PATENT DOCUMENTS

| | | |
|---|---|---|
| EP | 0660657 A1 * | 6/1995 |
| EP | 660 657 | 6/1995 |
| JP | 06152194 A * | 5/1994 |
| JP | 8-78896 | 3/1996 |

OTHER PUBLICATIONS

US 2001/0037566 A1; Nov. 11, 2001; Horigome.*
US 2001/0013170 A1; Aug. 16, 2001; Gamel et al.*
US 2002/0070362 A1; Jun. 13, 2002; Duquette.*
US 2001/0054691 A1; Dec. 27, 2001; Park et al.*
US 2002/0062927 A1; May 30, 2002; Hwang et al.*
European Search Report of Apr. 3, 2003.

* cited by examiner

Primary Examiner—Gregory L. Huson
Assistant Examiner—Khoa D. Huynh
(74) Attorney, Agent, or Firm—Rader, Fishman & Grauer PLLC; Ronald P. Kananen, Esq.

(57) ABSTRACT

An electronic component mounting apparatus uses sensors and a controller to correct the position at which a component holder, generally a suction nozzle, captures a component, thus avoiding component capture errors and failures. More specifically, sensors detect a deviation amount between a predetermined location on a component absorbed by a suction nozzle and the suction position of the suction nozzle. The deviation amount is multiplied by a sensitivity coefficient, and the resulting adjusted deviation amount is then applied by the controller to correct the position of the suction nozzle when capturing a subsequent component. Accordingly, the subsequent component is absorbed by the suction nozzle normal to the component and at a position substantially centered with respect to the component, reducing the occurrence of suction errors.

7 Claims, 11 Drawing Sheets

APPARATUS FOR AND METHOD OF CORRECTING COMPONENT HOLDING POSITION

CROSS REFERENCES TO RELATED APPLICATIONS

The present document is based on Japanese Priority Document JP 2000-235816, filed in the Japanese Patent Office on Aug. 3, 2000, the entire contents of which being incorporated herein by reference.

BACKGROUND OF THE INVENTION

1. Field of the Invention

The present invention relates to an apparatus for and a method of correcting a component holding position, and more particularly to an apparatus for and a method of correcting a component holding position in a component mounting apparatus for holding a component with a holder and mounting the component in a predetermined position.

2. Description of the Related Art

In an electronic circuit, electronic components are mounted in predetermined positions on a circuit board on which wiring patterns are formed in advance. Then, the electrical continuities are established between electrodes of those electronic components and the wiring patterns. Accordingly, the predetermined connections are attained.

When the electronic circuit is formed in this way, the components must be mounted in turn on a circuit board made of insulation material, in which predetermined wiring patterns are formed on a surface thereof. Here, a position at which the component is mounted must be a position at which the electrode must be normally connected to a land for the connection of the wiring patterns. If the position at which the component is mounted is deviated or out of alignment, a desired connection is not attained, which may result in an occurrence of an erroneous wiring or a short-circuit trouble.

A mount machine is used in order to automatically mount the circuit components on the insulation board. It is possible to avoid the above-mentioned problems by improving the mount accuracy of this mount machine.

The supply of the components in such an automatically mounting apparatus is carried out in a manner that it is accommodated in a concave portion on a tape to be fed from a component tape feed reel of a part cassette, and the component in the concave portion of the tape located at the position from which the component is taken out is taken out by an suction nozzle, and automatically mounted.

Japanese Laid Open Patent Application (JP-A-Heisei, 7-212095) discloses a component mount method for totaling a deviation amount in an inspection measurement result for each inspection unit of an inspection device at a step of mounting a component on a board, for each inspection unit, and estimating a deviation amount of the board from the totaled deviation amount for each inspection unit, and then estimating the deviation amount of the board or calculating a deviation amount from which the board deviation amount is subtracted for each inspection unit, on the basis of a difference between the estimated deviation amount for each inspection unit caused by the board deviation and the above-mentioned deviation amount for each inspection unit.

In the conventional above-mentioned automatic mounting apparatus, when this mounting apparatus holds a target component, it is treated that this target component is always located in advance at a predetermined position of a concave portion of a tape. However, in association with the reduction and the miniaturization in the dimension of the component to be treated in the component mounting apparatus, when the suction nozzle absorbs the component from a constant position, a trouble is brought about such as an erroneous capturing, a slant holding, a displacement of a holder or the like.

Figure 12:
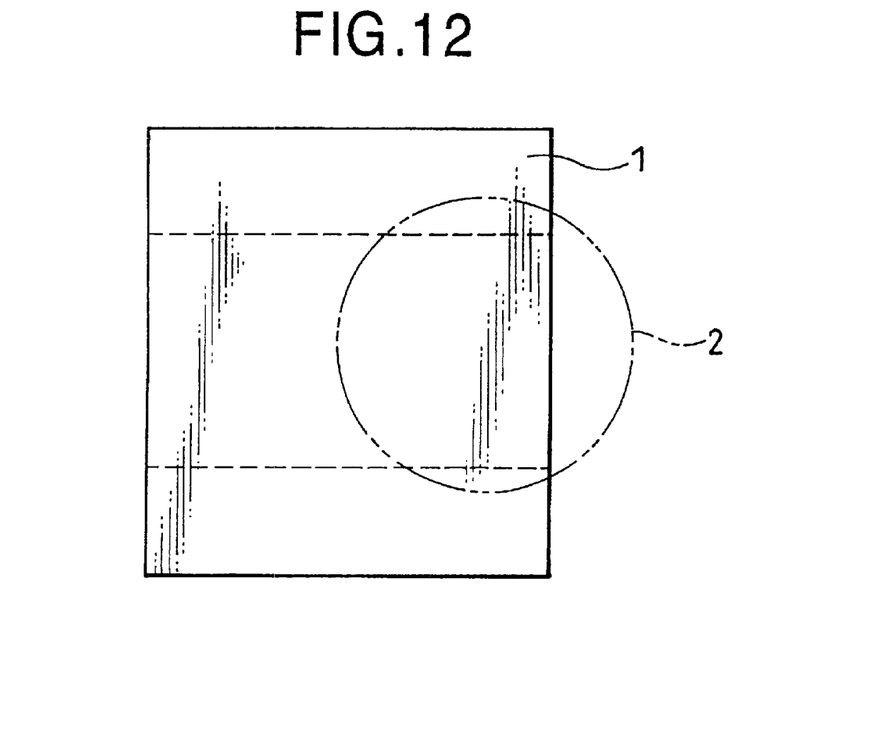
FIG. 12 is a plan view showing an operation for absorbing a component, by using an suction nozzle in a conventional component mounting apparatus.

FIG. 12 shows a case where a center of an suction nozzle 2 is deviated with respect to a center of a component 1. If image recognition is tried by a television camera in such condition, this try results in a problem that a shade of the nozzle 2 is erroneously recognized as a shade of the component 1.

Figure 13:
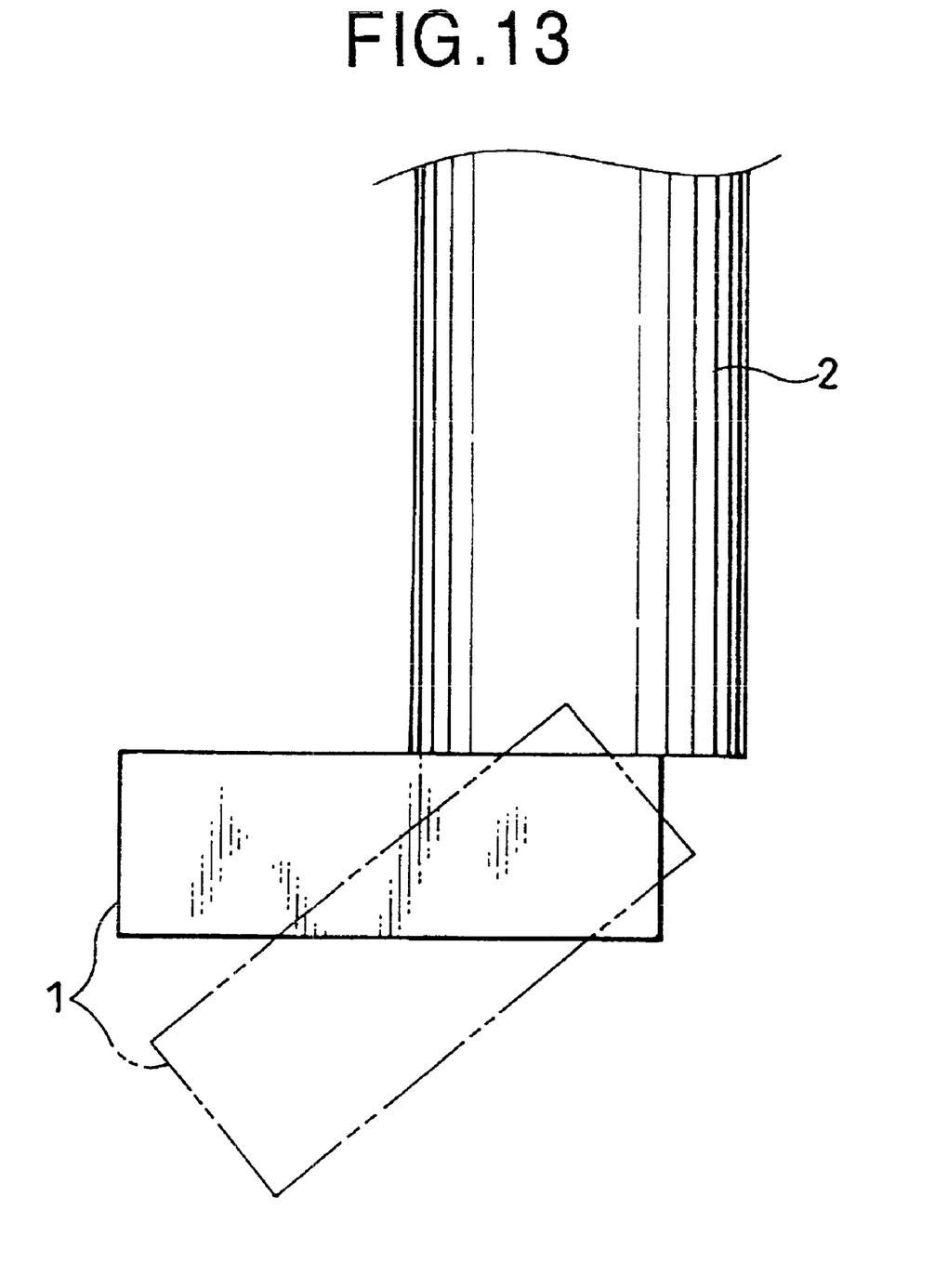
FIG. 13 is a side view showing a component absorbed by an suction nozzle.

Also, if the component 1 is absorbed at an offset state with respect to the center of the suction nozzle 2 as shown in FIG. 13, this results in a problem of a so-called standing suction at which an suction force causes the posture of the component 1 to be changed from a horizontal state to an oblique state. If the component 1 is obliquely absorbed in this way, the component 1 cannot be normally mounted on the circuit board, or the component 1 is fallen from the suction nozzle 2 in the course of the absorbing operation because of the lack of the suction force.

The failure of the suction of the component 1 as shown in FIG. 12 or FIG. 13 directly leads to an occurrence of a defective sample or a drop in productivity. So, such situation must be unlimitedly reduced to zero. Accordingly, the predetermined position of the component 1 needs to be normally held by the suction nozzle 2.

The method of analyzing the deviation of the circuit board and mounting components thereon disclosed in Japanese Laid Open Patent Application (JP-A-Heisei, 7-212095), although firstly trying to set the offset, uses the above-mentioned trial result in its original state after the trial, and does not change the offset in the course of the absorbing operation. Thus, in a case of a sequential mounting of the components, even if the first setting of the offset amount is normally carried out, the disorder of the offset amount during the mounting results in a problem that the normal amount operation is not always carried out. That is, even if the offset amount is normally set, if the offset amount is out of order after that, an suction error is brought about, which results in a problem of an occurrence of a mounting error.

The present invention is proposed in view of the above-mentioned circumstances and is to provide a component mounting apparatus which can solve a trouble caused by a deviation in a position of a component held by a holder, such as an suction nozzle or the like, and accordingly mount a component in position.

SUMMARY OF THE INVENTION

An aspect of the present invention relates to a component holding position correcting apparatus in a component mounting apparatus for holding a component with a holder and mounting the component in a predetermined, said correcting apparatus comprising:
- a detector for detecting a deviation of a holding position of the holder with respect to a standard position of the component; and
- a controller for correcting a holding position at which the holder holds a next component, on the basis of the deviation detected by the detector.

Here, the controller may correct the holding position, on the basis of a value in which the deviation detected by the detector is multiplied by a sensitivity coefficient. And, the standard position of the component is located at a substantial center of a plane held by the holder, or a position deviated by a predetermined direction and length with respect to the center.

Another aspect of the present invention relates to a component holding position correcting apparatus in a component mounting apparatus for holding a component from a component pickup position of a part cassette with an suction nozzle, and mounting the component in a predetermined position on a circuit board, said correcting apparatus comprising:

a detector for detecting a deviation of a holding position of the suction nozzle with respect to a standard position of the component; and a controller for correcting a holding position at which the suction nozzle holds a next component, on the basis of the deviation detected by the detector.

Here, the detector may be an image recognition camera. And, it may be designed such that the components are accommodated in concave portions for component accommodation, in a one-to-one relation of a tape, and the tape is sequentially fed on the part cassette, and the component located at the component pickup position is held by the suction nozzle.

Thus, according to such an apparatus for correcting a component holding position, the deviation amount of the holding position of the suction nozzle at a previous time can be used to carry out the correction for the holding position at which a next component is held. Thus, the holder can normally hold the next component. The sequential repetition of such operations enables the component to be always normally mounted on the predetermined position on the circuit board. Hence, it is possible to provide the component mounting apparatus having the high accuracy, the high stability and the high reliability.

The invention with regard to a method of correcting a component holding position is a method of correcting a component holding position, characterized in that in a component mounting apparatus for holding a component with a holder and mounting the component in a predetermined position, in which:

a detector detects a deviation of a holding position of the holder with respect to a standard position of the component, and a controller corrects a holding position at which the holder holds a next component, on the basis of the deviation detected by the detector.

A preferable embodiment in the present invention is designed such that each time a mount head holds a component in turn, a deviation amount of an suction position with respect to a center of the component is recognized by a usual camera for a mount position correction, and its deviation amount is fed back to a movement amount of the mount head when a next component is held. Here, at a time of the feedback, 100% of the deviation amount is not used, and a value obtained by multiplying the deviation amount by a sensitivity coefficient is fed back. Also, when a portion other than the center of the component is held by the holder, the above-mentioned feedback is carried out by considering in advance an offset amount of an suction position with respect to the center of the component.

If the correction operation via such feedback is repeated in turn, after a first component is normally held, a position of an suction head is automatically changed to an optimal position in turn each time a component is held. Not only the optimization of the holding position but also the optimization of the recognition position can be attained by using a mount position correction camera or a correction sensor as a camera for recognizing a holding position. That is, the component holding position of a robot is always stable. This stabilization enables the holding position to be located at the substantial center of the component. Thus, it can be recognized at the best sensitivity of the component recognition camera or sensor.

According to such an embodiment, the mounting apparatus tries to automatically keep the component holding position at the optimal position, which results in the sharp decrease in the erroneous capturing of a component frequently occurring in the conventional technique, namely, the accident of the non-suction of a component. Also, the suction holder automatically maintains its holding position, which results in the sharp decrease in the suction error, such as the erroneous suction of a corner of a component or the lateral suction of a component.

Since the holding position of the component via the holder is always stable, the recognition position of the fixed camera is also stabilized. Accordingly, it is possible to always recognize the component near a center position of the camera, at which a distortion of a lens or the like is little. This contributes to the improvement of the mount accuracy. Moreover, the holding position of the component via the holder is stabilized and located at the substantially center of the component. So, when the component is mounted at a certain angle, a calculation error is not easily brought about. Also, the holding position of the component via the holder is stabilized and located at the substantial center. Thus, it is possible to protect the suction nozzle constituting the holder from being located outside the component, and erroneously recognized as the component at the time of image recognition.

Thus, according to such a method of correcting a component holding position, the deviation amount of the holding position of the component detected by the detector is effectively used. Then, such a deviation amount is used to carry out the correction when the next component is held. Accordingly, the next component is normally held by the holder. Moreover, since this operation is infinitely repeated, the component can be mounted at the high stability and the high reliability.

DETAILED DESCRIPTION OF THE PREFERRED EMBODIMENTS

Figure 1:
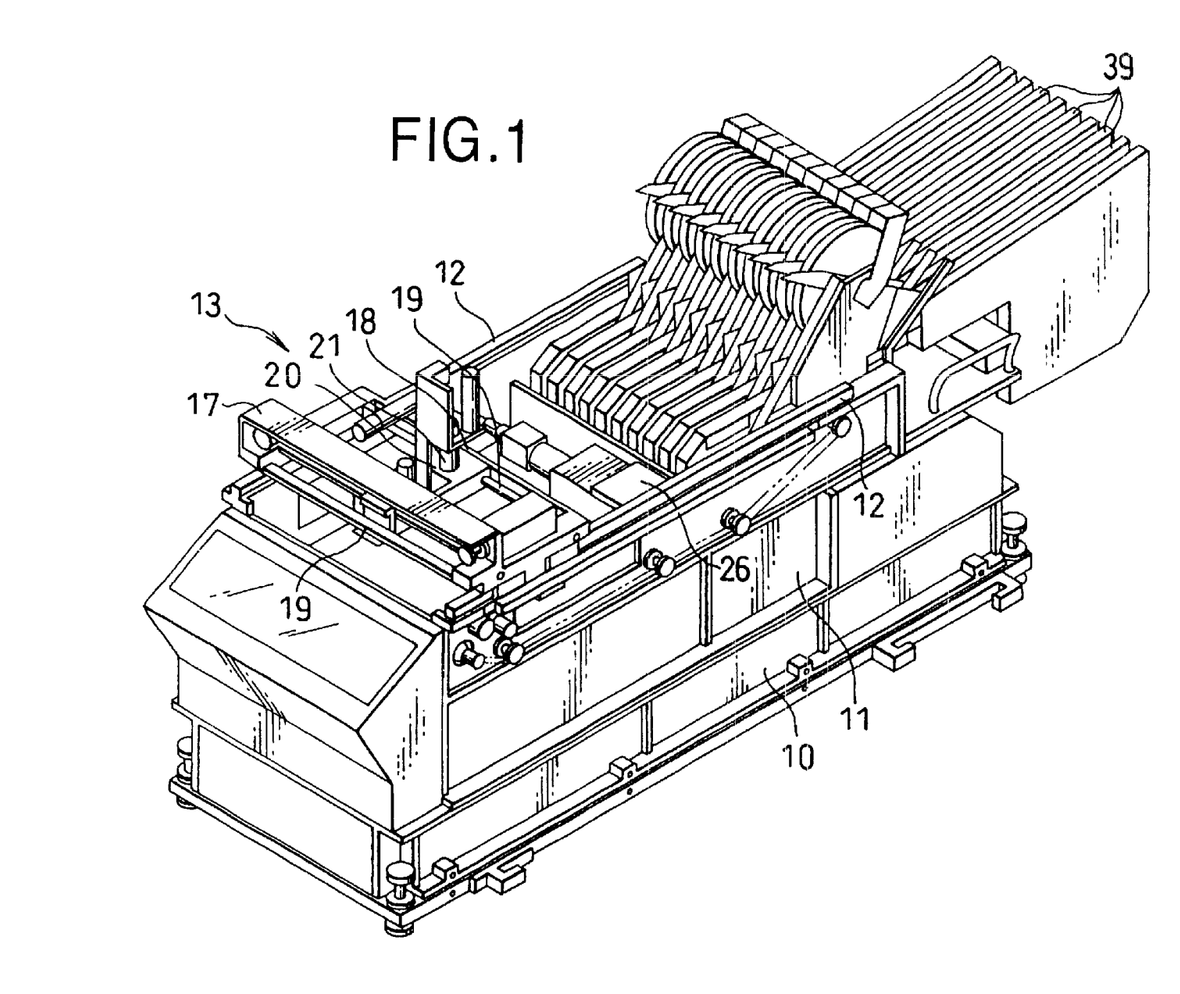
FIG. 1 is an external perspective view showing an entire structure of a component mounting apparatus of the present invention.
Figure 2:
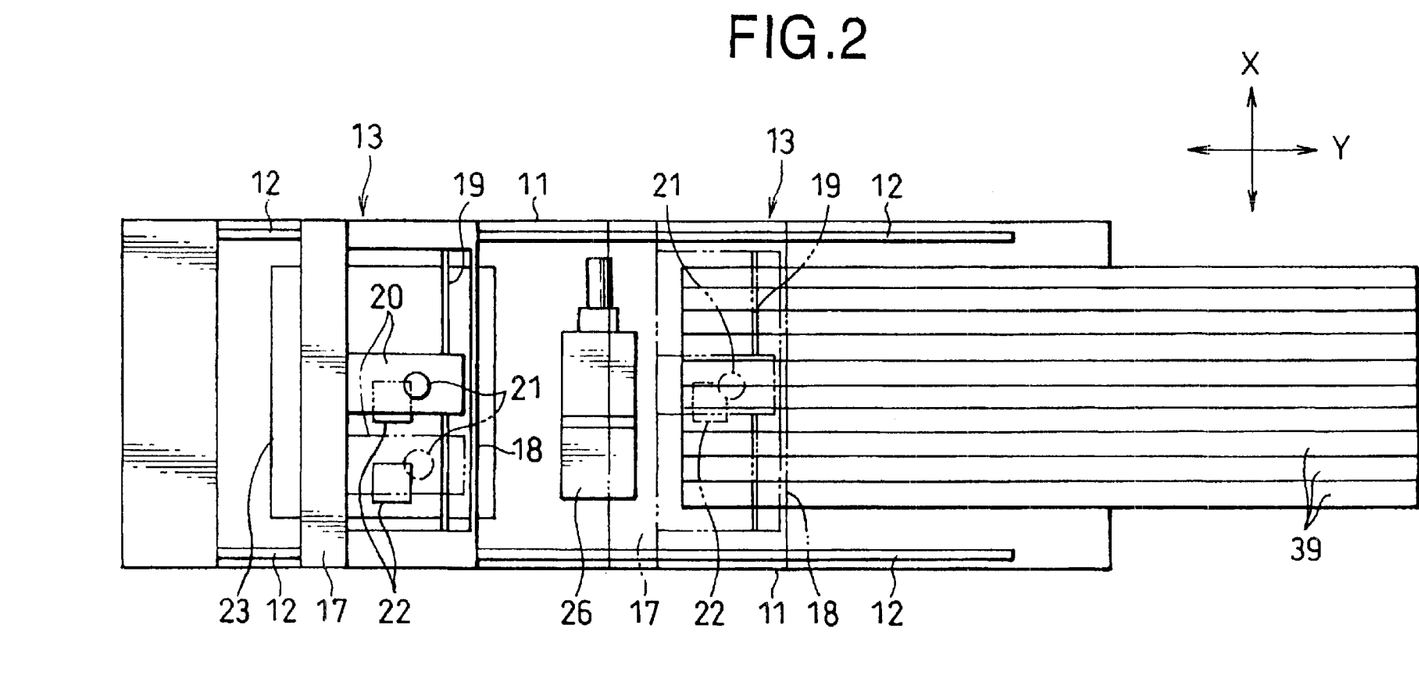
FIG. 2 is a plan view showing a main portion of the component mounting apparatus of FIG. 1.

FIGS. 1, 2 show the entire configuration of a component mounting apparatus having a component holding position correcting apparatus, according to an embodiment of the present invention. This component mounting apparatus has a base 10 on a bottom side thereof. A pair of left and right frames 11 is disposed on the base 10. Y-axis rails 12 are formed on a top surface of the frames 11 in the longitudinal direction. Then, so as to straddle the Y-axis rails 12 on both the sides, a carriage 13 is supported movably in the longitudinal direction of the Y-axis rails 12.

The carriage 13 has a pair of stays 17, 18 before and after it. This constitutes the structure straddling the Y-axis rails 12 on both the sides. Also, the carriage 13 has a pair of X-axis rails 19 in a square direction in the Y-axis direction, and supports a mount head 20 movably in the X-axis direction by using the X-axis rails 19.

An suction nozzle 21 is downwardly disposed in the mount head 20 so that a component is absorbed by a tip of the nozzle 21, as described later. A board recognition camera 22 is disposed on a bottom surface of the mount head 20 so that this board recognition camera 22 recognizes a circuit board 23 that is inserted into and fixed to a lower side of the carriage 13 from a side direction. Also, in the movement direction of the carriage 13 moved along the Y-axis rail 12, a component recognition camera 26 is fixedly disposed on the lower side of the movement direction, so as to recognize an image of the component absorbed by the suction nozzle 21.

Figure 3:
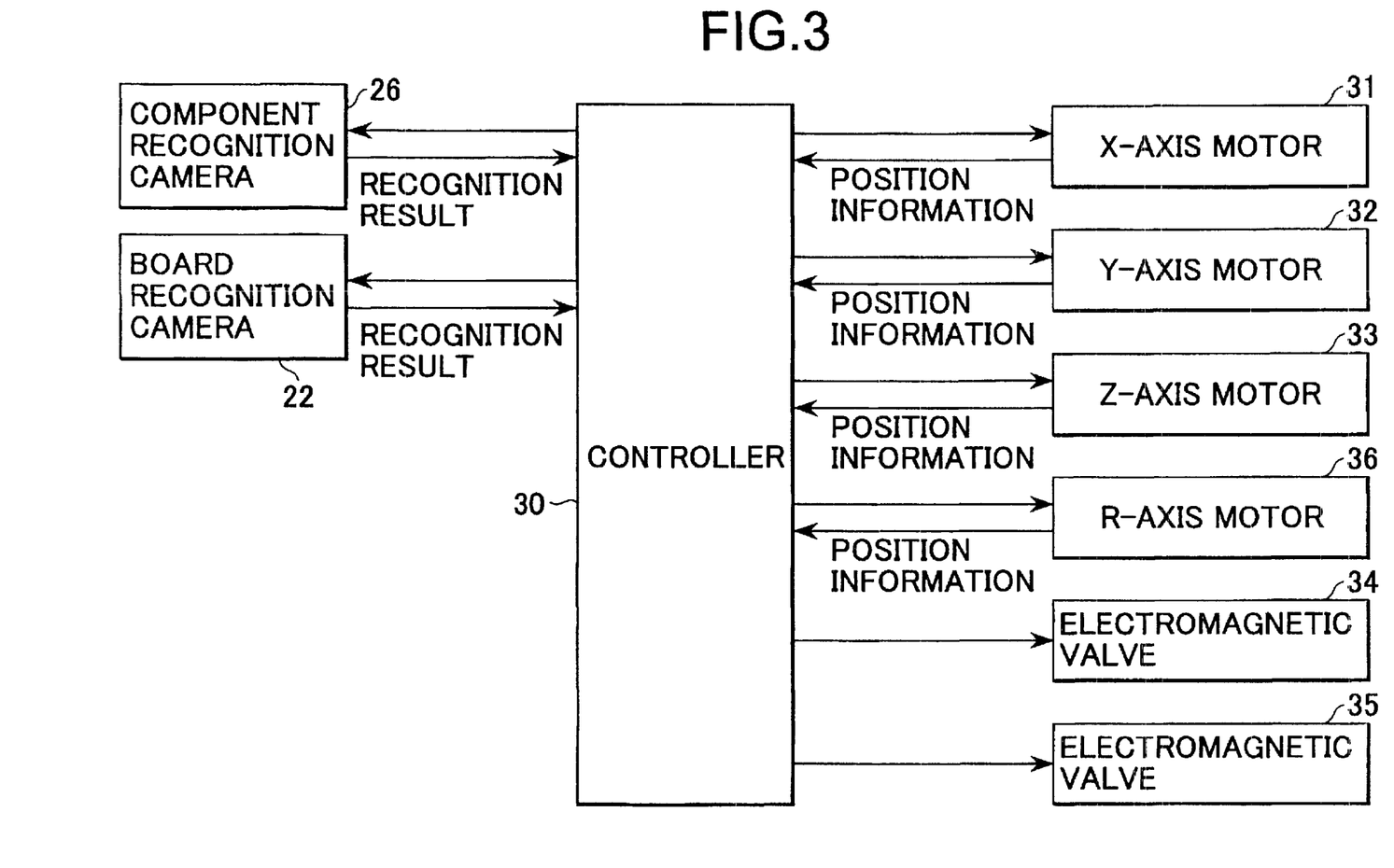
FIG. 3 is a block diagram showing a control system of the component mounting apparatus.

FIG. 3 is a block diagram showing a control system of such a component mounting. This control system has a controller 30 including a computer. The controller 30 controls an X-axis motor 31 for moving the mount head 20 in the X-axis direction, a Y-axis motor 32 for moving the carriage 13 in the Y-axis direction, a Z-axis motor 33 for moving the suction nozzle 21 in its height direction, namely, in the Z-axis direction, and an R-axis motor 36 for rotating the suction nozzle 21 with an axis line as a center. By the way, position information fetched by encoders (not shown) of those motors 31, 32, 33 and 36 is fed back to the controller 30. Also, the controller 30 controls an electromagnetic valve 34 for controlling the exhaust and the suction of the suction nozzle 21, and an electromagnetic valve 35 for controlling the supply and the exhaust of air to and from an air cylinder for controlling a drive of a feed lever of a later-described part cassette. Moreover, the board recognition camera 22 and the component recognition camera 26 are connected to the controller 30.

The component mounting apparatus shown in FIGS. 1, 2 has a plurality of, for example, 10 pieces of part cassettes 39 on the rear side thereof. It supplies the components at the condition that they are contained in tapes through those part cassettes 39. The supplied components are absorbed by the suction nozzle 21 of the mount head 20, one by one, and mounted on the circuit board 23.

Figure 4:
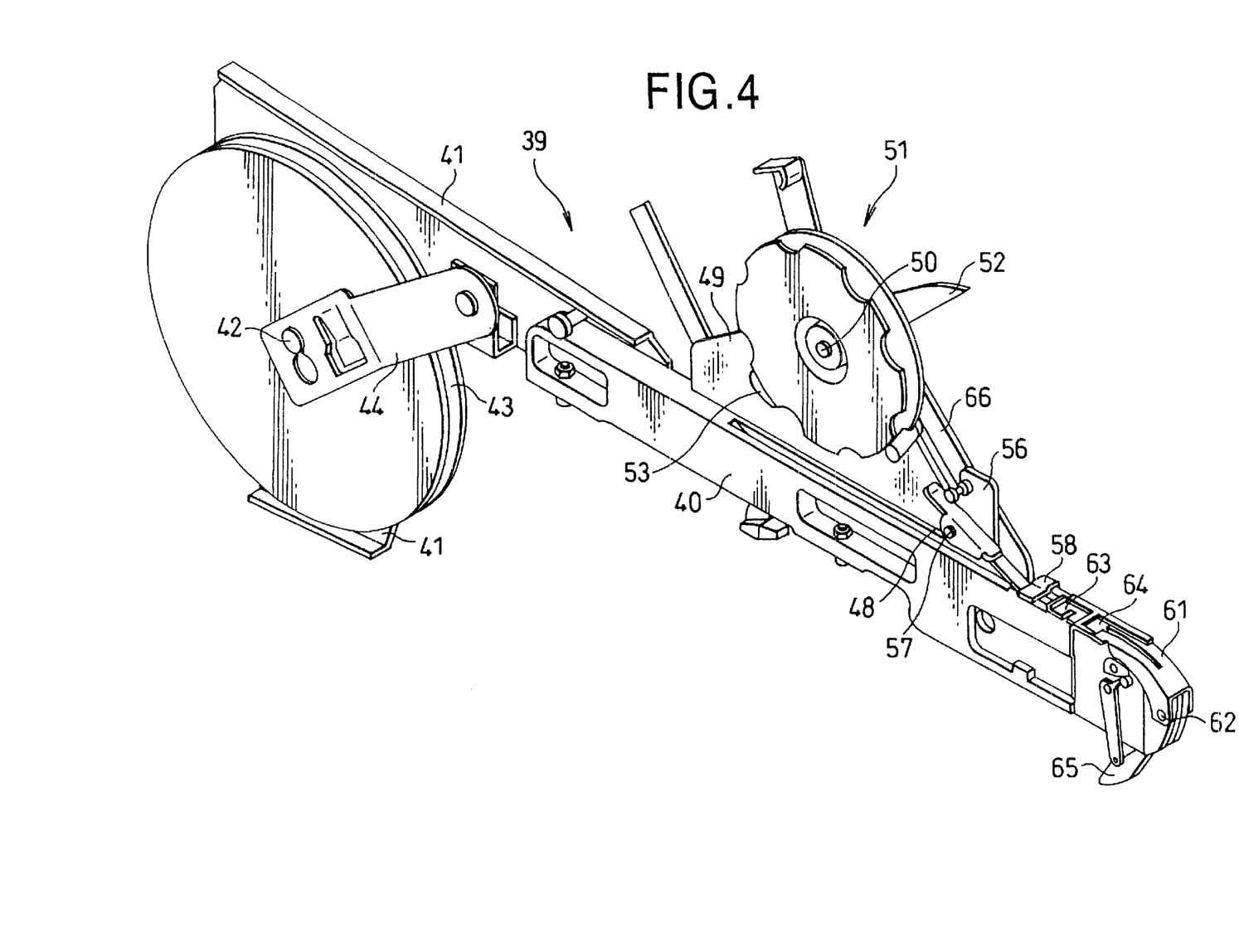
FIG. 4 is an external perspective view showing a part cassette.

The part cassette 39 has a base 40 made of aluminum die-cast, as shown in FIG. 4. A frame 41 formed by pressing and molding an aluminum plate is fixed to a portion of a back end of the base 40. So, a component tape feed reel 43 is installed by using pins 42 protuberantly disposed so as to be horizontally extended on the side of this frame 41. The feed reel 43 is pushed by a push arm 44.

The top surface of the base 40 serves as a guide plane 48. The components are fed through this guide plane 48 from the feed reel 43. An installation plate 49 is fixed to the side of the base 40. A top tape take-up reel 51 is installed through a pin 50 to this installation plate 49. A first feed lever 52 is rotatably installed on the side of the top tape take-up reel 51. The rotation of the first feed lever 52 is converted into the rotational motion of the top tape take-up reel 51 through a ratchet nail 53. This conversion enables the top tape to be reeled.

An assistant plate 56 is installed above the guide plane 48 of the base 40 which is located on the side of the installation plate 49. An assistant lever 58 is installed through a pin 57 by this assistant plate 56.

A cover 61 is installed through a pin 62 at a portion of a tip side of the base 40, and a shutter 63 is slidably disposed on the back side of this cover 61. So, a component pickup hole 64 is made before this shutter 63 so that the component packed in the form of the tape is taken out from this component pickup hole 64.

A second feed lever 65 is rotatably installed on a side of a front end of the base 40. This feed lever 65 is linked through a linkage link 66 to the first feed lever 52.

Figure 5:
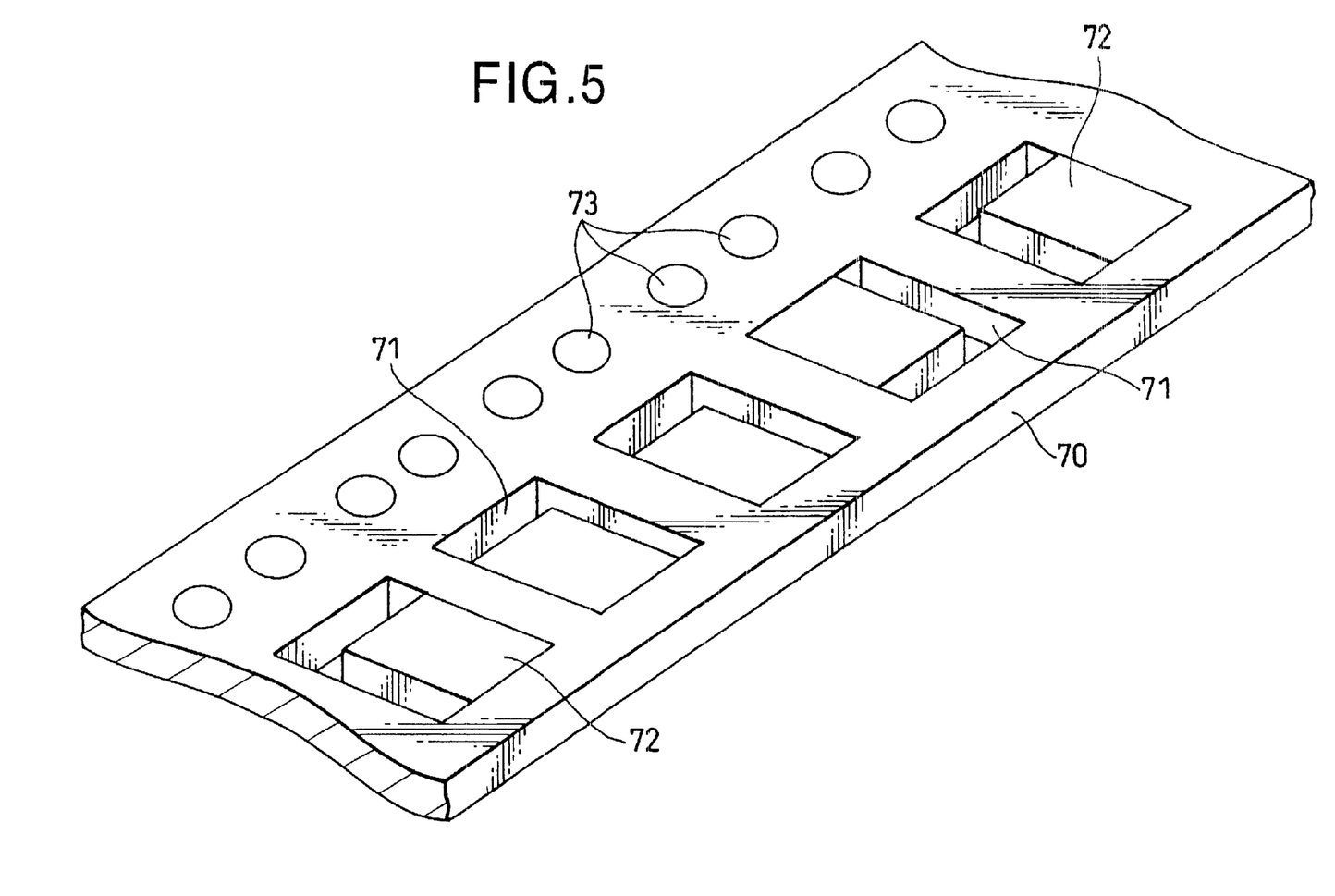
FIG. 5 is an external perspective view of a tape for feeding and supplying a component.
Figure 6:
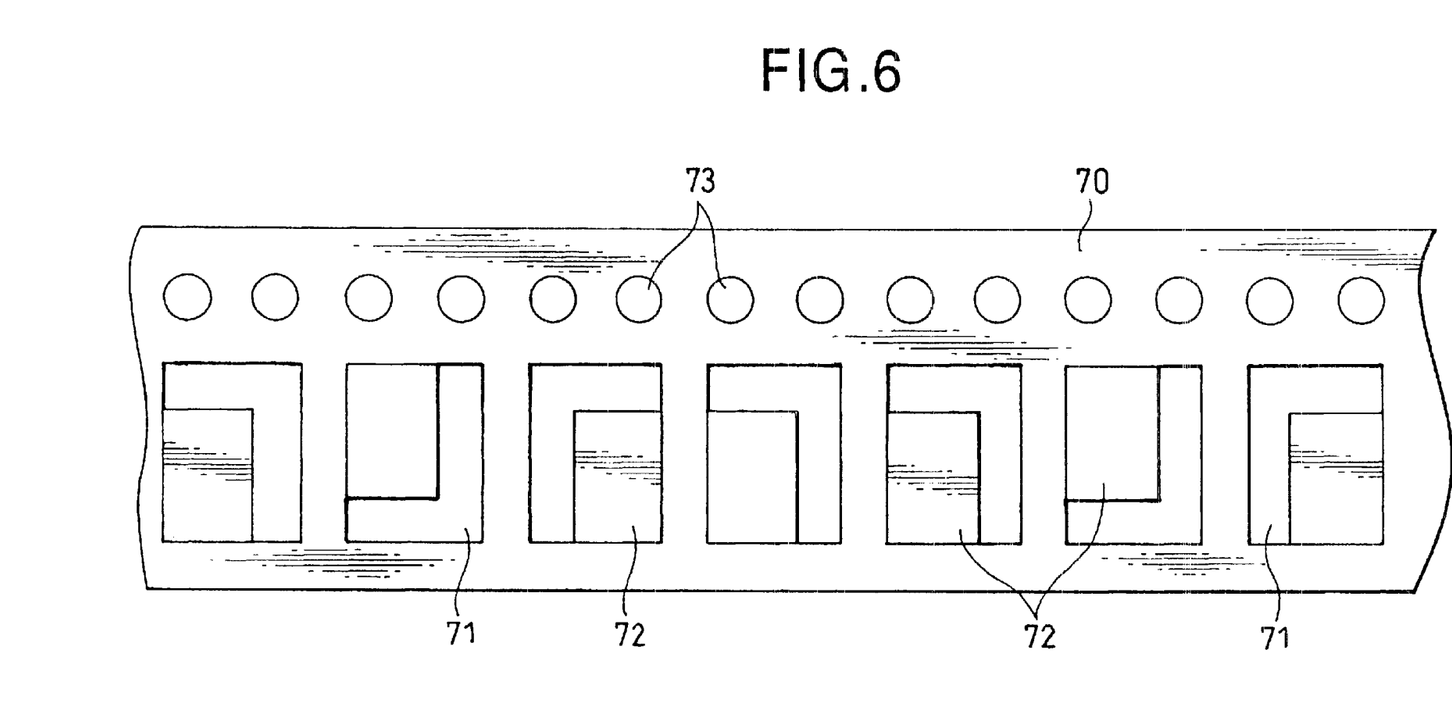
FIG. 6 is a plan view showing the tape.

The components fed by the above-mentioned part cassettes 39 are accommodated in concave portions 71 formed on a tape 70, as shown in FIGS. 5, 6. Components 72 are covered by a top tape in the condition that each of the components 72 is accommodated in each corresponding concave portion 71. Moreover, the components are fed in the wrapped state by the component tape feed reel 43.

The above-mentioned operation for mounting on the circuit board 23 the components 72 fed by the tape 70 will be schematically described below. When the electromagnetic valve 35 is switched in accordance with a command of the controller 30 shown in FIG. 3, an actuator (not shown) linked to the electromagnetic valve 35 is operated to accordingly operate the first feed lever 52 or the second feed lever 65 of the part cassette 39 shown in FIG. 4. By the way, the feed levers 52, 65 as the pair are linked to each other through the link 66. Thus, the rotation of one feed lever enables the other feed lever to be rotated at the same time.

The above-mentioned rotation of the feed levers 52, 65 causes an intermittently feeding mechanism for the tape 70 on the lower side of the cover 61 to be operated. Thus, the top tape is stripped. Then, when the tape 70 reeled by the top tape take-up reel 51 arrives at the position of the component pickup hole 64 of the base 40, the component 72 in the concave portion 71 at that position faces to the component pickup hole 64.

The controller 30 in FIG. 3 controls so as to operate the Y-axis motor 32, move the carriage 13 backward along the Y-axis rail 12, and also move the mount head 20 in the X-axis direction along the X-axis rail 19 by using the X-axis motor 31, and then move the suction nozzle 21 of the mount head 20 to a portion above the component draw position 64.

In a condition that the suction nozzle 21 is located on the component pickup hole 64 of the corresponding part cassette 39, the controller 30 operates the Z-axis motor 33. Accordingly, the suction nozzle 21 is lowered to then absorb the component 72 in the concave portion 71 of the tape 70. By the way, at this time, vacuum suction is carried out in the suction nozzle 21 by switching the electronic circuit valve 34. At this state, the Z-axis motor 33 is again operated in the opposite direction so that the suction nozzle 21 is moved upwardly in the Z-axis direction.

After that, the controller 30 instructs the Y-axis motor 32 to move the carriage 13 forwardly along the Y-axis rail 12, and further instructs the X-axis motor 31 to move the mount head 20 along the X-axis direction. Also, it instructs the R-axis motor 36 to rotate the suction nozzle 21 so that the component 72 is located in a normal orientation. Then, it instructs the suction nozzle 21 to be located above the component recognition camera 26, and it recognizes the image of the component 72 absorbed by the suction nozzle 21.

After the completion of the image recognition of the component 72 absorbed by the suction nozzle 21, the controller 30 instructs the Y-axis motor 32 to again move the carriage 13 to the front side in the Y-axis direction. Also, it instructs the X-axis motor 31 to move the mount head 20 in the X-axis direction. Then, the suction nozzle 21 is moved so as to be located at a position above a predetermined mount position of the circuit board 23 whose image is recognized by the board recognition camera 22 in advance. The suction nozzle 21 is rotated by the R-axis motor 36, so as to adjust an angle of the component 72. At this state, the Z-axis motor 33 is operated to lower the suction nozzle 21. Accordingly, the component 72 absorbed at the predetermined position on the circuit board 23 by the suction nozzle 21 is mounted.

The sequential repetition of such operations enables the various components respectively accommodated in the plurality of part cassettes 39 to be normally mounted at the respective mount positions. By the way, the circuit board 23 is accommodated and fixed between the pair of frames 11 from the side of the frames 11. Then, if the mount of the predetermined components is completed, it is again taken out from between the frames 11.

The component mounting apparatus provided with the mount machines shown in FIGS. 1, 2 constitutes a unit for mounting chip components. It is designed such that the component 72 supplied at the condition at which it is accommodated in the concave portion 71 of the tape 70 shown in FIGS. 5, 6 is absorbed by the suction nozzle 21 of the mount head 20, and the component image is recognized by the component recognition camera 26, and it is mounted on the target circuit board 23 at the accurate position and posture. By the way, the component 72 is usually referred to as a tape type component. Accordingly, the components 72 are supplied in series at the condition that they are accommodated in the concave portions 71 composed of cavities, in the one-to-one relation, as shown in FIGS. 5, 6.

The concave portions 71 are formed on the tape 70, as mentioned above. When the first feed lever 52 or the second feed lever 65 of the part cassette 39 shown in FIG. 4 is rotated, the concave portions 71 are always located at the predetermined positions by feeding the concave portions 71 of the tape 70 at a constant interval. By the way, minute gap exists between the feed hole 73 made on the side of the concave portion 71 of the tape 70 so as to feed this tape 70 via the rotation of the feed lever 52 or 65 and the pin of the tape feed mechanism of the part cassette 39. Also, a predetermined clearance is disposed between the component 72 and the concave portion 71 of the tape.

Also, the mount machine shown in FIGS. 1, 2 employs the method in which the component supply device itself composed of the combination of the part cassettes 39 can be detached from this mount unit, in order to improve the operational performance when the component is replaced. Thus, there may be a possibility that the detachment of the part cassette 39 results in an installation error between it and this mount machine, and this installation error leads to the suction error. Also, when one part cassette 39 is replaced with another part cassette 39, an error of a manufacturing accuracy is brought about.

Such clearance, error, tolerance and the like cause the error to be brought about in the suction position with regard to the component 72 of the suction nozzle 21. So, in this mount unit, the solution of the trouble is tried by carrying out the correction for the suction position with regard to the component 72 of the suction nozzle 21 on the basis of the error so that the substantial center of the component 72 is always absorbed and held by the suction nozzle 21.

Figure 7:
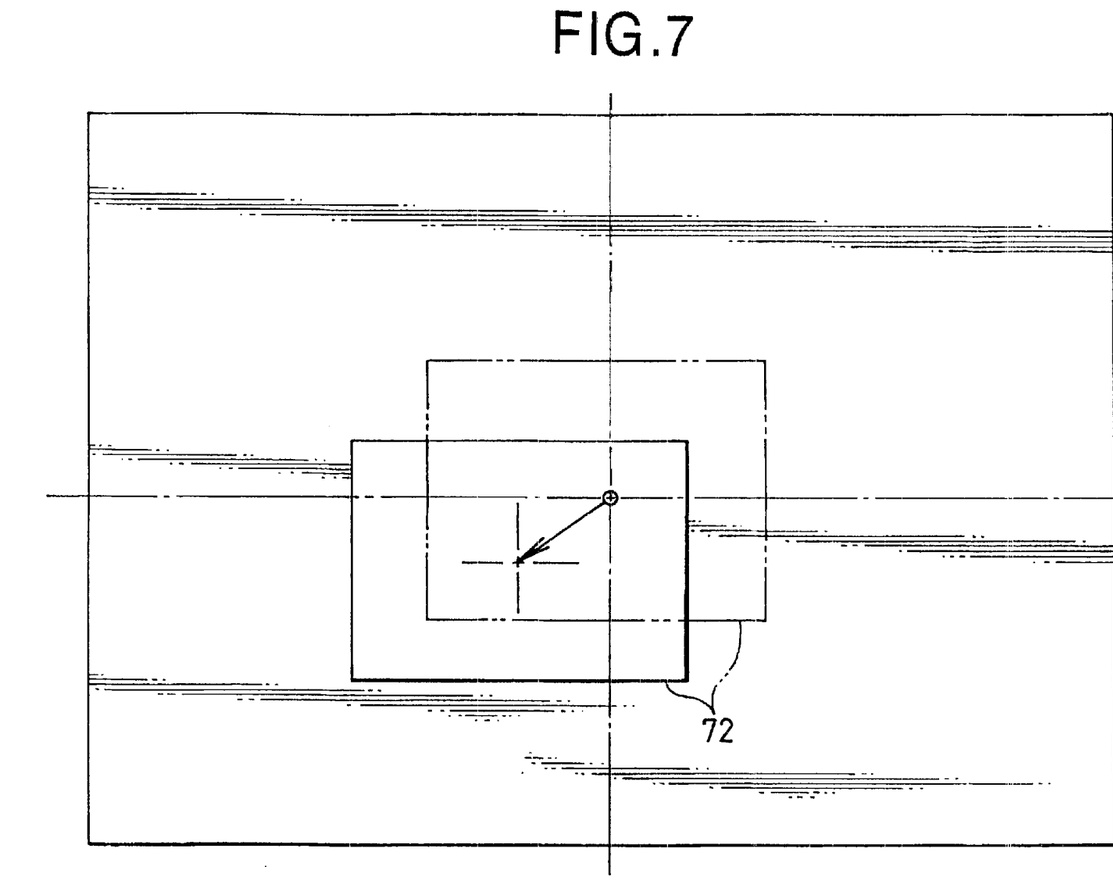
FIG. 7 is a plan view showing image recognition of an absorbed component.

This operation will be described below with reference to a flowchart shown in FIG. 8. An suction position is set on the basis of a design value or a simple indication under an assumption of a predetermined error. Then, a first component 72 is absorbed and held by the suction nozzle 21. The absorbed and held component 72 is accurately mounted on the circuit board 23. Thus, its component image is recognized by the component recognition camera 26 constituted by a fixed camera shown in FIGS. 1, 2. A position in a visual field of the camera shown in FIG. 7 for which the held position of the suction nozzle 21 is set at this time is already known. Thus, data for the mount is an offset amount of the absorbed component 72 with respect to the suction nozzle 21. This data is used not only for the correction for the mount position with respect to the circuit board 23 but also for the correction for the suction position via the suction nozzle 21.

As its principle, the offset amount with respect to the absorbed component 72 of the suction nozzle 21 is added to the suction position of the component 72 via the suction nozzle 21. Here, if the offset amount in its original state, namely, at 100%, is added to the suction position to then correct a next offset amount, this may result in an excessive susceptibility to a random error induced for each component 72. Thus, in this case, an offset amount multiplied by a sensitivity coefficient "a" smaller than 1 is added to the suction position. This is given by the following equation:

$$\begin{bmatrix} Xp \\ Yp \end{bmatrix}_{n+1} = \begin{bmatrix} Xp \\ Yp \end{bmatrix}_n + a \begin{bmatrix} Xo \\ Yo \end{bmatrix} \quad (1)$$

Here, (Xp, Yp) indicates a component suction position, and (Xo, Yo) indicates an offset amount at a center of the component 72 with respect to a center of the suction nozzle 21. Also, "a" is a sensitivity coefficient of $0 < a \leq 1$.

By the way, if a target component 72 for the mount is already rotated to a mount angle and its component image is recognized by the component recognition camera 26, it needs to be reversibly rotated by its angular recognition error and returned back prior to the above-mentioned calculation. This is because the machine shown in FIGS. 1, 2, when being rotated to mount the component 72 after absorbing it with the suction nozzle 21, recognizes the component 72 with the component recognition camera 26 after the rotation. Thus, if the suction nozzle 21 is rotated, the recognized result need to be returned back to the original angle. Hence, if a rotation of θ degrees is applied to the suction nozzle 21 prior to the recognition of the component 72, the above-mentioned equation is modified to be the following equation:

$$\begin{bmatrix} Xp \\ Yp \end{bmatrix}_{n+1} = \begin{bmatrix} Xp \\ Yp \end{bmatrix}_n + a \begin{pmatrix} \cos\theta & \sin\theta \\ -\sin\theta & \cos\theta \end{pmatrix} \begin{bmatrix} Xo \\ Yo \end{bmatrix} \quad (2)$$

In this equation, the coefficient including sin θ and cos θ in a second term on a right side is a coefficient to return the rotational amount back to the original value.

Figure 8:
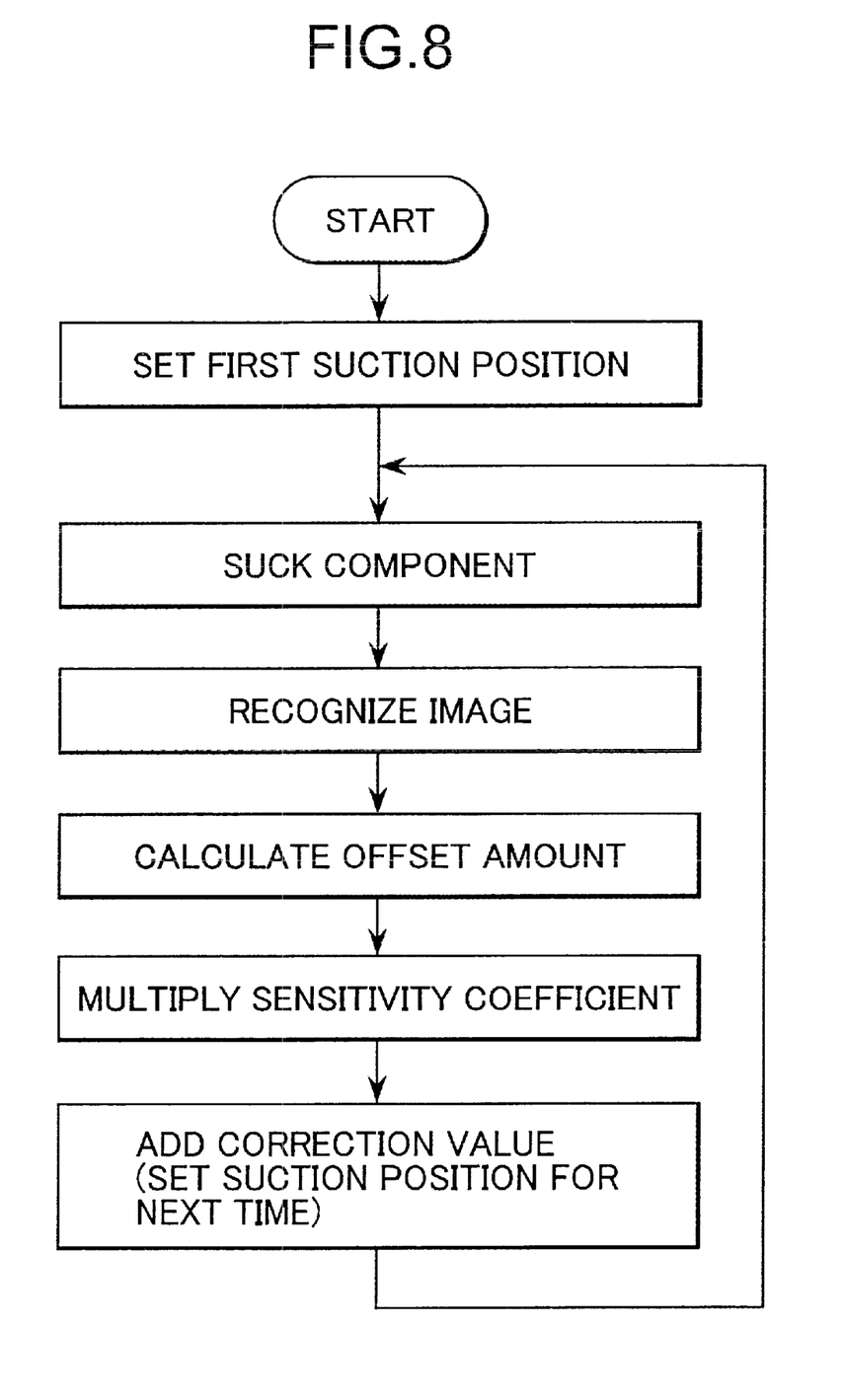
FIG. 8 is a flowchart showing an operation for correcting an suction position.

Due to the introduction of the control operation for the correction as shown in FIG. 8, the suction nozzle 21 always repeats the operation for automatically keeping the component holding position at the optimal state. Accordingly, it is possible to suppress the suction trouble caused by the deviation between the center of the component 72 and the suction nozzle 21, namely, the failure of the capture and the non-suction. Moreover, the value in which the offset amount is multiplied by the sensitivity coefficient "a" is added in this case. Thus, even if a particular component 72 is offset to an extreme position, it is not necessary to carry out the correction so that a next component is sensitively reactive to that case. Hence, the addition of the correction suitable for the deviation amount enables the mount operation of the stable repetition of the component 72.

Figure 9:
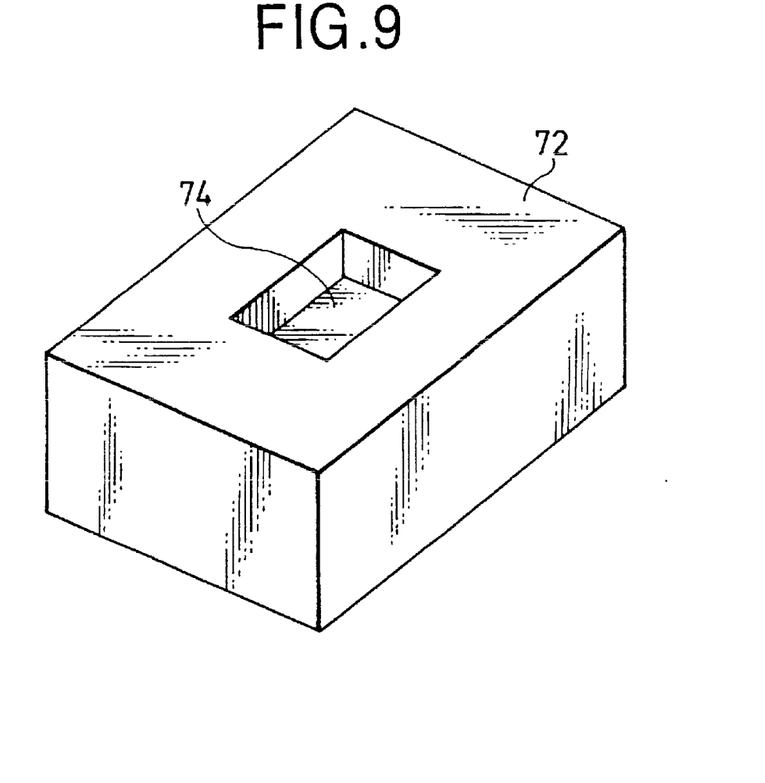
FIG. 9 is a perspective view showing a component having a concave portion in an upper portion.
Figure 10:
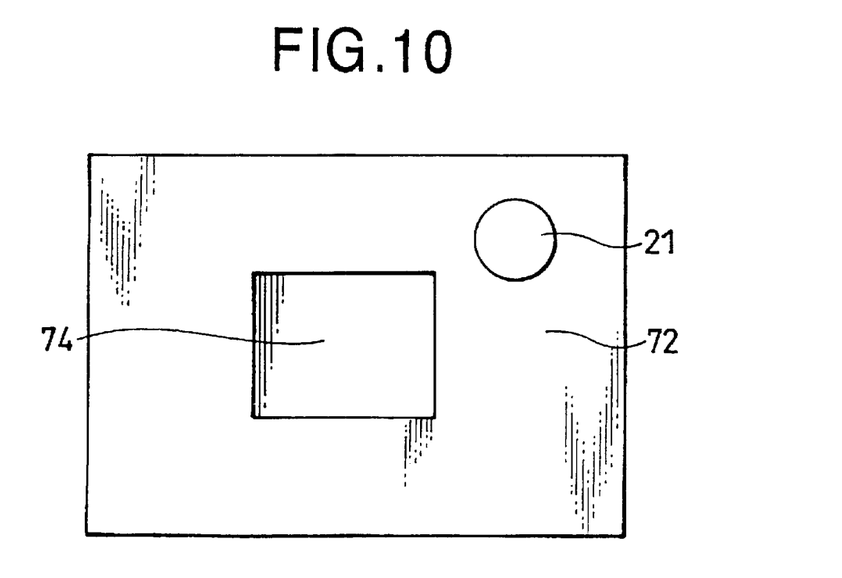
FIG. 10 is a plan view showing the component of FIG. 9.
Figure 11:
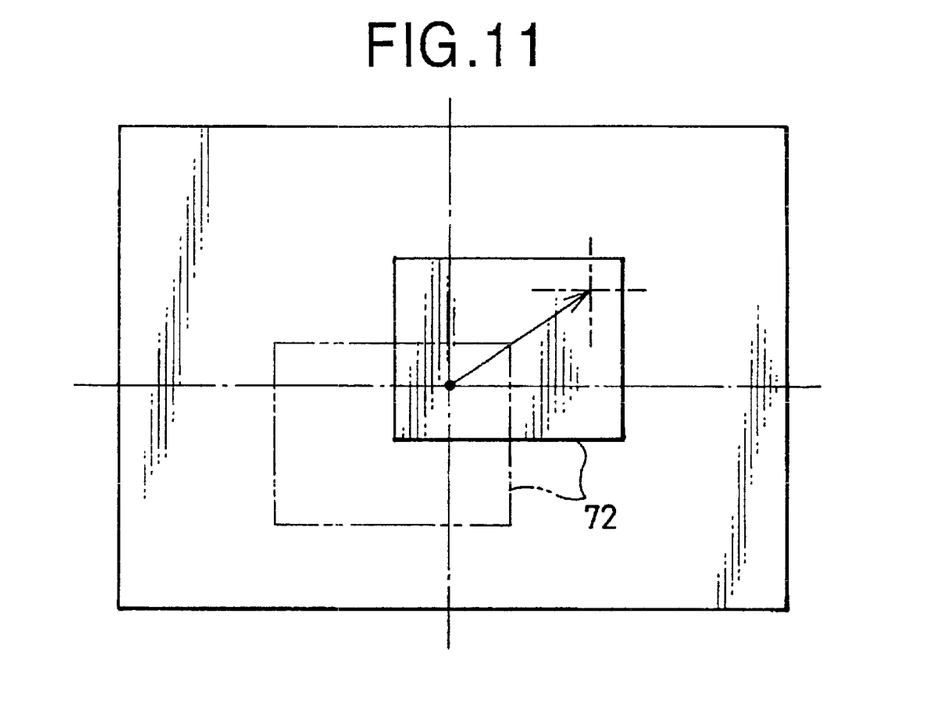
FIG. 11 is a plan view showing a state of image recognition of the component.

Another embodiment will be described below with reference to FIGS. 9 to 11. In a case where a concave portion 74 exists in a substantial center of a top surface constituting a surface to be absorbed of the component 72 as shown in FIG. 9, such a concave portion 74 disables the center of the component 72 to be absorbed by the suction nozzle 21. Thus, in this case, as shown in FIG. 10, the peripheral portion other than the concave portion 74 of the component 72 is absorbed by the suction nozzle 21. Hence, in this case, a correction may be added in which an offset amount at an suction position with respect to the center of the component 72 is considered in advance. That is, the correction is carried out in accordance with the following equation:

$$\begin{bmatrix} Xp \\ Yp \end{bmatrix}_{n+1} = \begin{bmatrix} Xp \\ Yp \end{bmatrix}_n + \begin{bmatrix} Xn \\ Yn \end{bmatrix} + a \begin{bmatrix} Xo \\ Yo \end{bmatrix} \quad (3)$$

Here, (Xn, Yn) indicates the normal suction position of the suction nozzle 21 with respect to the center of the component 72. The addition of such correction enables the correction for the case of the suction at the position when the suction nozzle 21 is deviated by a predetermined amount in a predetermined direction with respect to the center of the component 72.

As mentioned above, the present invention has been explained by using one embodiment. However, the present invention is not limited to the above-mentioned embodiment. Various modifications can be made thereto within the range of the technical spirit of the present invention included in this application.

For example, the mount unit in the above-mentioned embodiment has the structure in which the CCD camera is used as the component recognition camera 26. However, even a line sensor using an LED as the component recognition camera 26 can attain the same functions. Also, in addition to them, the component recognition can be attained by using a method of a non-contact sensor, an X-ray or the like. Here, the mount machine using the part cassettes 39 is indicated as a component feeder. However, it can be widely applied to a component mounting apparatus using a bulk feeder cassette, a stick type component supply cassette, or a tray type component feeder.

What is claimed is:

1. A component holding position correction apparatus in a component mounting apparatus for holding a component with a suction nozzle and mounting the component in a predetermined position, said component holding position correcting apparatus comprising:

a detector for detecting the deviation of a holding position of the suction nozzle with respect to a standard position of the component; and a controller for correcting the holding position of the suction nozzle on the basis of the deviation detected by said detector, characterized in that the deviation amount of a holding position of the suction nozzle is used to carry out the correction for the holding position at which the next component is held, wherein said controller corrects the holding position on the basis of a value at which the deviation detected by said detector is multiplied by a sensitivity coefficient.

2. The component holding position correcting apparatus according to claim 1, wherein said standard position of said component is essentially located at the center of a plane of said component held by said holder.

3. The component holding position correcting apparatus according to claim 1, wherein said standard position of said component is a position deviated by a predetermined direction and length with respect to, in essence, a center of a plane of a component held by said holder.

4. A method of correcting a component holding position in a component mounting apparatus for holding a component with a suction nozzle and mounting the component in a predetermined position, said method comprising the steps of:

detecting a deviation of a holding position of the suction nozzle with respect to a standard position of a first component; and correcting a holding position for a next component by the suction nozzle on the basis of the detected deviation of the first component, wherein the correcting step including correcting the holding position on the basis of a value at which the deviation detected by said detector is multiplied by a sensitivity coefficient.

5. An electronic component mounting apparatus comprising:

a component holding device;

a detector for detecting a deviation of a holding position of said component holding device with respect to a standard position of a component being held by said component holding device; and a controller for correcting a holding position at which said component holding device acquires a next component, wherein said controller corrects said holding position of said component holding device on the basis of a value where the deviation detected by said detector is multiplied by a sensitivity coefficient.

6. The electronic component mounting apparatus according to claim 5, wherein said controller corrects said holding position of said holding device on the basis of the deviation detected by said detector.

7. The electronic component mounting apparatus according to claim 5, wherein said component holding device is a suction nozzle.

* * * * *